(12) United States Patent
Kise et al.

(10) Patent No.: US 6,212,252 B1
(45) Date of Patent: Apr. 3, 2001

(54) X-RAY MASK PROVIDED WITH AN ALIGNMENT MARK AND METHOD OF MANUFACTURING THE SAME

(75) Inventors: Koji Kise; Hideki Yabe; Sunao Aya; Kaeko Kitamura; Kenji Marumoto; Shigeto Ami, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/177,826

(22) Filed: Oct. 23, 1998

(30) Foreign Application Priority Data

Apr. 1, 1998 (JP) .................................................. 10-088436

(51) Int. Cl.$^7$ ....................................................... G21K 5/00
(52) U.S. Cl. ............................................. 378/35; 378/205
(58) Field of Search ...................... 378/34–35, 205–206; 430/22, 5, 311–313, 296, 323; 250/492.2; 356/399–401

(56) References Cited

U.S. PATENT DOCUMENTS

| 4,873,162 | 10/1989 | Yoshioka et al. . |
| 5,496,667 | 3/1996 | Yabe et al. . |
| 5,677,090 | 10/1997 | Marumoto et al. . |
| 6,040,095 | * 3/2000 | Enichen et al. ........................ 430/5 |

FOREIGN PATENT DOCUMENTS

| 60077422 | 10/1983 | (JP) . |
| 64-36019 | * 2/1989 | (JP) . |
| 2-166720 | 6/1990 | (JP) . |
| 4-297016 | 10/1992 | (JP) . |
| 04142022 | * 5/1995 | (JP) . |
| 8-250392 | 9/1996 | (JP) . |

* cited by examiner

*Primary Examiner*—David V. Bruce
(74) *Attorney, Agent, or Firm*—McDermott, Will & Emery

(57) ABSTRACT

An X-ray mask which is provided with an alignment mark and a transfer circuit pattern having a high position accuracy can be manufactured through a simplified manufacturing process.

A membrane allowing passage of X-rays is formed on a substrate. A X-ray absorber intercepting transmission of X-rays is formed on the membrane. The substrate includes a window exposing the membrane. The X-ray absorber includes a transfer circuit pattern and an alignment mark formed in a region not overlapping with the window in a plan view.

11 Claims, 10 Drawing Sheets

X-RAY MASK PROVIDED WITH AN ALIGNMENT MARK AND METHOD OF MANUFACTURING THE SAME

BACKGROUND OF THE INVENTION

1. Field of the Invention

The present invention relates to an X-ray mask and a method of manufacturing the same, and particularly an X-ray mask provided with an alignment mark, which is used for position detection in a process of forming a circuit pattern for transfer, as well as a method of manufacturing the same.

2. Description of the Background Art

In a processes of manufacturing semiconductor devices, a lithography technology utilizing ultraviolet rays has been primarily used for transferring a circuit pattern such as an interconnection pattern onto a semiconductor substrate. For example, the semiconductor devices have been integrated to a higher extent and, for example, DRAMs (Dynamic Random Access Memories) have been improved to have higher densities and higher storage capacities of, e.g., 1 gigabit (Gbit). As a result, it is now required to miniaturize circuit patterns for interconnections or the like to a higher extent.

It is now expected that a lithography technology using X-rays can be a useful technology for transferring such fine circuit patterns. According to the lithography technology using X-rays, X-rays which are used for exposure have a wavelength (soft X-ray: wavelength=5–20 nm) shorter than that of ultraviolet rays which have been used in the prior art, and therefore can transfer fine circuit patterns of a higher resolution than that transferred by the conventional lithography using ultraviolet rays.

The lithography technology using X-rays uses an X-ray mask provided with a circuit pattern for transfer.

FIG. 27 is a cross-sectional view showing a structure of a conventional X-ray mask. Referring to FIG. 27, the conventional X-ray mask will be described below.

In FIG. 27, the conventional X-ray mask includes a substrate 102, a membrane 103, an X-ray absorber 104 and a support ring 101.

Membrane 103 is a substrate allowing passage of X-rays, and is formed on substrate 102. Membrane 103 has a film thickness of 1–3 μm. X-ray absorber 104 is made of a material intercepting transmission of X-rays, and is formed on membrane 103. Substrate 102 is provided with a window 111. A rear surface of membrane 103 is exposed through window 111. In a region located on window 111, X-ray absorber 104 includes a portion 110 for forming a transfer circuit pattern, i.e., a circuit pattern for transfer. Support ring 101 is arranged under substrate 102.

The circuit pattern formed in transfer circuit pattern forming portion 110 of X-ray absorber 104 must have a high position accuracy and a high size accuracy.

The transfer circuit pattern is usually produced through the following steps. First, a resist (not shown) is applied onto X-ray absorber 104. The transfer circuit pattern is written on the resist with an electron beam lithography system. Development is effected on this resist to form a mask pattern of the transfer circuit pattern. Using this mask pattern as a mask, etching is performed to remove X-ray absorber 104, whereby the transfer circuit pattern layer is formed.

In the above step of writing the transfer circuit pattern on the resist with the electron beam lithography system for forming the transfer circuit pattern, the accuracy of position detection significantly affects the accuracies of the position and size of the transfer circuit pattern of the X-ray mask.

The step of writing the transfer circuit pattern with the electron beam includes the following specific steps. First, the X-ray mask including a resist applied over X-ray absorber 104 is attached to a jig called an EB cassette. Then, the X-ray mask is conveyed together with the EB mask into a load-lock chamber (i.e., an area provided for keeping a vacuum around the X-ray mask prior to writing so that the X-ray mask can be conveyed into an area, where writing with the electron beam can be performed, while keeping a vacuum). Then, a vacuum is produced in the load-lock chamber. Subsequently, the X-ray mask is conveyed together with the EB cassette from the load-lock chamber onto a stage in the area for the electron beam writing. The circuit pattern for transfer is written on the resist of the X-ray mask with the electron beam. The writing of the transfer circuit pattern with the electron beam is performed while detecting and referring to positions of alignment marks situated on the EB cassette or the stage.

Usually, there is a difference in temperature between the X-ray mask, the interior of the load-lock chamber and the area for the electron beam writing. When producing a vacuum in the load-lock chamber, the temperatures of the EB cassette and the X-ray mask lower. After the X-ray mask is conveyed onto the stage in the area for the electron beam writing, therefore, the temperatures of the EB cassette and the X-ray mask change until they reach an equilibrium with the temperature of the area where the electron beam writing is performed. As a result, the EB cassette and the X-ray mask conveyed onto the stage expand or shrink due to this change in temperature.

The temperature of the X-ray mask is stabilized to some extent as a certain time elapses. However, a long time is required until the temperature of the EB cassette carrying the X-ray mask or the stage is stabilized. Therefore, it is impossible to write accurately the transfer circuit pattern with the electron beam before the temperature of the entire area for the electron beam writing reaches an equilibrium.

In the conventional process, therefore, the X-ray mask and the EB cassette which were conveyed onto the stage are left standing on the stage for a long time until the entire area for the electron beam writing reaches an equilibrium. The electron beam writing of the transfer circuit pattern is performed after the entire area for the electron beam writing reaches an equilibrium.

The fact that the standing state must be kept until the entire area for the electron beam writing reaches an equilibrium results in increase in manufacturing period of the X-ray mask, and consequently increases a manufacturing cost of the X-ray mask.

In order to reduce the time for which the standing state is kept before writing the transfer circuit pattern with the electron beam, the alignment mark may be formed on the X-ray mask itself instead of the EB cassette or the stage. This is because the alignment mark, which is formed on the X-ray mask, does not change its position once the temperature of only the X-ray mask is stabilized, even before the entire area for the electron beam writing reaches an equilibrium.

Japanese Patent Laying-Open No. 2-166720 (1990) has disclosed an X-ray mask provided with an alignment mark, which is made of a material having a high electron beam reflection coefficient and is formed on the surface of the X-ray mask. FIG. 28 is a perspective view of the X-ray mask proposed in the above publication. Referring to FIG. 28, the X-ray mask already proposed will be described below.

The proposed X-ray mask in FIG. 28 includes a support material 105, a X-ray transmissive material 106 allowing passage of X-rays, an X-ray absorber 104 and alignment marks 107. X-ray transmissive material 106 is formed on support material 105. X-ray absorber 104 is formed on X-ray transmissive material 106. Alignment marks 107 are made of gold films and are formed on X-ray absorber 104.

For forming alignment marks 107 (see FIG. 28), this proposed X-ray mask requires an additional process for forming gold films on X-ray absorber 104. This complicates the process of manufacturing of the X-ray mask, and increases the manufacturing period.

Japanese Patent Laying-Open No. 4-297016 has disclosed an X-ray mask, in which alignment mark providing reference positions are formed on an X-ray absorber. In the X-ray mask disclosed in Japanese Patent Laying-Open No. 4-297016, however, the alignment marks are formed in a region on a membrane where a mask pattern is formed. Therefore, the reference position of the alignment marks shifts due to distortion caused by a heat and a resist stress relief, which are generated or caused when a pattern for forming the mask pattern is written on a resist.

SUMMARY OF THE INVENTION

An object of the invention is to provide an X-ray mask which includes a transfer circuit pattern having a high position accuracy, and can be manufactured by a simplified manufacturing process.

Another object of the invention is to provide a method of manufacturing an X-ray mask, which includes a transfer circuit pattern having a high position accuracy, and can be manufactured by a simplified process.

According to an aspect of the invention, an X-ray mask includes a substrate, a membrane allowing passage of X-rays, and an X-ray absorber intercepting transmission of X-rays. The membrane allowing passage of X-rays is formed on the substrate. The X-ray absorber is formed on the membrane. The substrate includes a window exposing the membrane. The X-ray absorber includes a transfer circuit pattern, and an alignment mark formed in a region not overlapping with the window in a plan view.

According to the above aspect, the alignment mark is formed on the X-ray absorber of the X-ray mask without an additional step, which is required for the X-ray mask already proposed and is performed for forming a film of gold or the like for the alignment mark on the X-ray absorber. Therefore, the X-ray mask provided with the alignment mark can be produced through a more simple manufacturing process than that in the prior art.

In the step of forming the transfer circuit pattern on the X-ray mask, the alignment mark formed on the X-ray mask can be used for detecting the position of the X-ray mask. Therefore, it is not necessary to wait until the temperature of the whole area for the electron beam writing of the transfer circuit pattern reaches an equilibrium in contrast to the prior art, and the X-ray mask provided with the transfer circuit pattern having a high accuracy can be manufactured without the wait.

According to the above aspect, the alignment mark is situated in the region, which is spaced from the region for forming the transfer circuit pattern, and is situated in the region covering the membrane overlying the substrate. Therefore, a significant variation in position of the alignment mark can be prevented even when the membrane located on the window vibrates in a step of writing a mask pattern for forming the transfer circuit pattern or a distortion occurs due to resist stress relief or heat caused by the mask pattern writing step. Consequently, it is possible to prevent deterioration of an accuracy of position detection of the X-ray mask which may be caused by a variation in position of the alignment mark or the like. Accordingly, the X-ray mask can have the transfer circuit pattern having a higher accuracy.

In the X-ray mask according to the above aspect, the alignment mark may be an opening formed in the X-ray absorber.

According to the above structure, the step of forming the alignment mark can employ a technique such as etching which is used in the step of forming the transfer circuit pattern. Therefore, the alignment mark can be formed easily without adding a complicated process.

In the X-ray mask according to the above aspect, a protective film may be arranged between the substrate and the X-ray absorber.

According to another aspect, the invention provides a method of manufacturing an X-ray mask, in which a membrane allowing passage of X-rays is formed on a substrate. An X-ray absorber intercepting transmission of X-rays is formed on the membrane. A window exposing the membrane is formed in the substrate. A first mask layer is formed on the X-ray absorber. A first mask pattern is written on the first mask layer. Development is effected on the first mask layer to form a first mask pattern layer. The X-ray absorber is removed using the first mask pattern layer as a mask, whereby an opening functioning as an alignment mark is formed in a region not overlapping with the opening in a plan view.

According to the above method, it is not necessary to form a film of gold or the like on the X-ray absorber, which is required for forming the alignment mark in a conventional X-ray mask. Therefore, the X-ray mask provided with the alignment mark can be produced through simplified steps, compared with the X-ray mask proposed in the prior art.

According to the above aspect, the alignment mark is formed in the region, under which the substrate is present with the membrane therebetween. Therefore, a significant variation in position of the alignment mark can be prevented even when the membrane located on the window vibrates in a step of writing a mask pattern for forming the transfer circuit pattern or a distortion occurs due to resist stress relief or heat caused by the mask pattern writing step. Consequently, it is possible to prevent deterioration of an accuracy of position detection of the X-ray mask which may be caused by a variation in position of the alignment mark or the like. Accordingly, the X-ray mask can have the transfer circuit pattern having a higher accuracy.

In the method of manufacturing the X-ray mask according to the above aspect, the first mask pattern layer may be removed and a second mask layer may be formed on the X-ray absorber. A second mask pattern may be written on the second mask layer while performing position detection of the second mask layer using the opening as the alignment mark. Development may be effected on the second mask layer to form a second mask pattern layer. The X-ray absorber may be removed to form a transfer circuit pattern, using the second mask pattern layer as a mask.

According to the above method, the opening is used as the alignment mark when performing the position detection. Therefore, it is not necessary to wait until the temperature of an EB cassette for the electron beam writing of the transfer circuit pattern reaches an equilibrium in contrast to the prior art, and the X-ray mask provided with the transfer circuit pattern having a high position accuracy can be produced through a simplified manufacturing process.

In the method of manufacturing the X-ray mask according to the above aspect, a second mask pattern may be written on the first mask layer while performing position detection of the first mask layer using the opening as an alignment mark. A second mask pattern layer may be formed by effecting development on the first mask layer. The transfer circuit pattern may be formed by removing the X-ray absorber, using the second mask pattern layer as a mask.

According to this method, both the first and second mask patterns are written on the first mask layer. Therefore, the steps of manufacturing the X-ray mask can be simplified compared with the case where a mask layer other than the first mask layer is formed for writing the second mask pattern.

In the method of manufacturing the X-ray mask according to the above aspect, the step of writing the first mask pattern may include an exposure step using light, and the step of writing the second mask pattern may include a writing step using an electron beam.

According to the above manner, the step of writing the first mask pattern employs the exposure method using light which requires a shorter exposing time than the exposure method using an electron beam. Therefore, the time required for manufacturing the X-ray mask can be shorter than that in the case where the electron beam exposure method is used for writing the first and second mask patterns.

In the method of manufacturing the X-ray mask according to the above aspect, the step of forming the second mask layer may include a step of forming a second mask layer exposing the opening on the X-ray absorber.

According to this method, a resist or the like is not present on the opening functioning as the alignment mark even when an electron beam is emitted to the opening for position detection of the opening. Therefore, a problem which may arise in the case where the resist is present on the opening can be prevented and, more specifically, such a problem can be prevented that characteristics of the resist are deteriorated due to irradiation with the electron beam and thereby the position detection of the opening with the electron beam is impeded. As a result, position detection of the alignment mark can be performed accurately. Thereby, it is possible to write the second mask pattern having a high position accuracy. Consequently, the X-ray mask provided with the transfer circuit pattern having a high accuracy can be manufactured easily.

In the method of manufacturing the X-ray mask according to the above aspect, the step of forming the opening may include a first etching step of removing the X-ray absorber, and the step of forming the transfer circuit pattern may include a second etching step of removing the X-ray absorber. The first and second etching steps may be performed under different conditions, respectively.

The above method can employ etching conditions suitable to the size of the opening functioning as the alignment mark as well as etching conditions suitable to the sizes of the interconnection pattern and others of the transfer circuit pattern, even if the former and latter sizes are different from each other. Consequently, both the opening and the transfer circuit pattern can be formed with high position accuracies. Therefore, the X-ray mask provided with the transfer circuit pattern having a high size accuracy and a high position accuracy can be produced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below.

(Embodiment 1)

An X-ray mask of an embodiment 1 of the invention will be described below with reference to FIG. 1.

Figure 1:
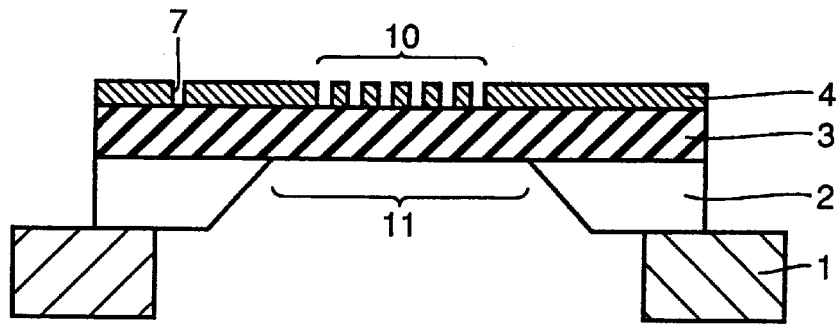
FIG. 1 is a cross-sectional view of an X-ray mask of an embodiment 1 of the invention.

Referring to FIG. 1, the X-ray mask of the embodiment 1 of the invention includes a support ring 1, a substrate 2, a membrane 3 and an X-ray absorber 4. Membrane 3 is formed on substrate 2. X-ray absorber 4 is formed on membrane 3. Support ring 1 is arranged under substrate 2. Substrate 2 is provided with a window 11,. through which a rear surface of membrane 3 is exposed. X-ray absorber 4 includes a transfer circuit pattern 10, i.e., a circuit pattern for transfer in a region located above window 11. X-ray absorber 4 includes an opening 7, which functions as an alignment mark and is located in a region not overlapping with window 11 in a plan view, i.e., a region outside window 11.

Since opening 7 functioning as the alignment mark is formed in X-ray absorber 4 as described above, it is not necessary to form a film of gold or the like functioning as the alignment mark on X-ray absorber 4 in contrast to the X-ray mask proposed in the prior art. Therefore, the X-ray mask provided with the alignment mark can be produced without an additional step of forming a film of gold or the like.

In a process of manufacturing the X-ray mask which will be described later, a step of forming the transfer circuit pattern on X-ray absorber 4 can be performed using opening 7 for detecting the position on the X-ray mask. Therefore, the transfer circuit pattern having a high position accuracy can be formed.

Opening 7 is situated in the region spaced from the region wherein transfer circuit pattern 10 is formed, and more specifically in a region, under which substrate 2 is present with membrane 3 therebetween. Therefore, significant change in position of opening 7 can be prevented in the step of writing the mask pattern for forming transfer circuit pattern 10, even when membrane 3 situated on window 11 vibrates or a distortion occurs due to resist stress relief or heat caused by the step of writing the mask pattern. Consequently, it is possible to prevent lowering of the accuracy of position detection of the X-ray mask, which may be caused by change in position of opening 7. Therefore, the transfer circuit pattern having a high position accuracy can be formed.

A process of manufacturing the X-ray mask of the embodiment 1 of the invention shown in FIG. 1 will now be described below with reference to FIGS. 2 to 6.

Figure 2:
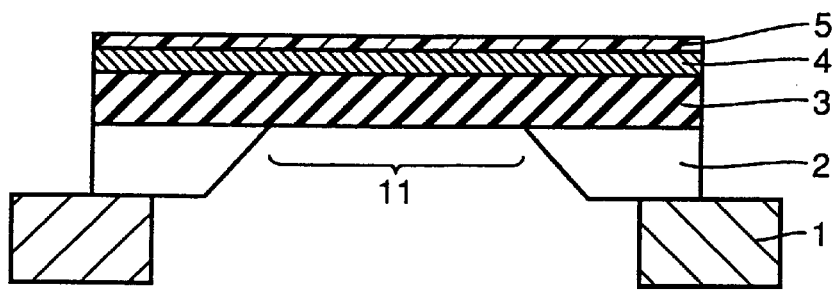
FIGS. 2 to 6 are cross-sectional views showing 1st to 5th steps in a process of manufacturing the X-ray mask of the embodiment 1 of the invention shown in FIG. 1, respectively.

As shown in FIG. 2, membrane 3 of 1–3 $\mu$m in thickness is first formed on substrate 2. X-ray absorber 4 is formed on membrane 3. A resist 5 is applied over X-ray absorber 4. Support ring 1 is disposed under substrate 2. Substrate 2 is partially removed by etching to form window 11 exposing the rear surface of membrane 3.

Figure 3:
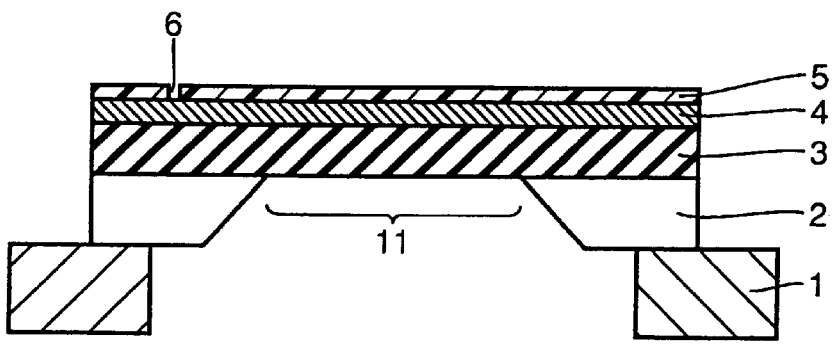

As shown in FIG. 3, exposure with light and development are effected to form an alignment mark pattern 6, i.e., a pattern for the alignment mark in resist 5. In this step, alignment mark pattern 6 is formed in a region which does not overlap with window 11 in a plan view and, in other words, is located outside window 11.

As described above, the step of forming alignment mark pattern 6 uses the light exposing method requiring a shorter exposure time than an exposing method with an electron beam, which is employed for forming the transfer circuit pattern to be described later. Therefore, the time required for manufacturing the X-ray mask can be reduced compared with the case where the electron beam writing method is used for writing both alignment mark pattern 6 and the transfer circuit pattern on the resist. The step of forming alignment mark pattern 6 may use the exposing method using the electron beam.

Figure 4:
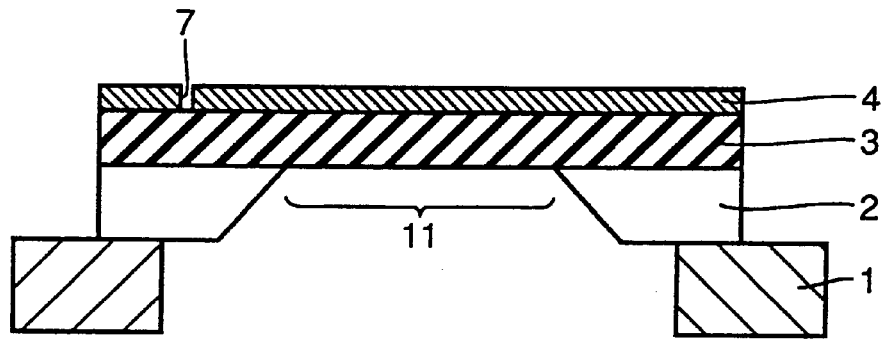

Thereafter, X-ray absorber 4 masked with resist 5 is partially removed by etching to form opening 7 functioning as the alignment mark. Thereafter, resist 5 is removed. Through the above steps, the structure shown in FIG. 4 is formed.

As described above, opening 7 functioning as the alignment mark is formed in X-ray absorber 4. Therefore, the process of manufacturing the X-ray mask can be simplified by eliminating a film forming step or deposition step required in the conventionally proposed method, in which a film of gold or the like is formed on X-ray absorber 4, and the alignment mark is formed by patterning this film of gold or the like by etching.

Figure 5:
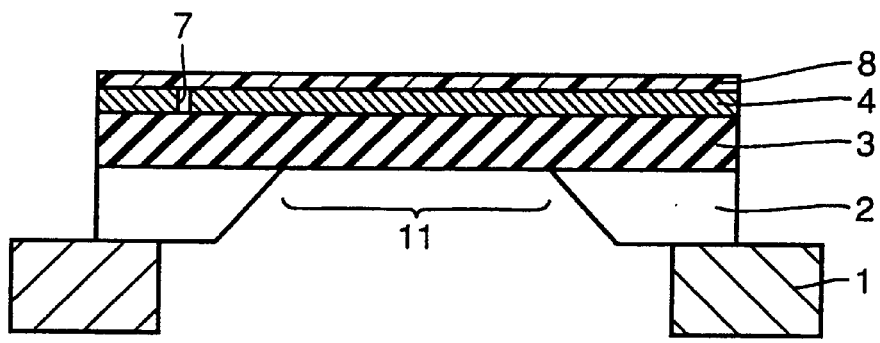

Then, resist 8 is applied over X-ray absorber 4 as shown in FIG. 5.

Figure 6:
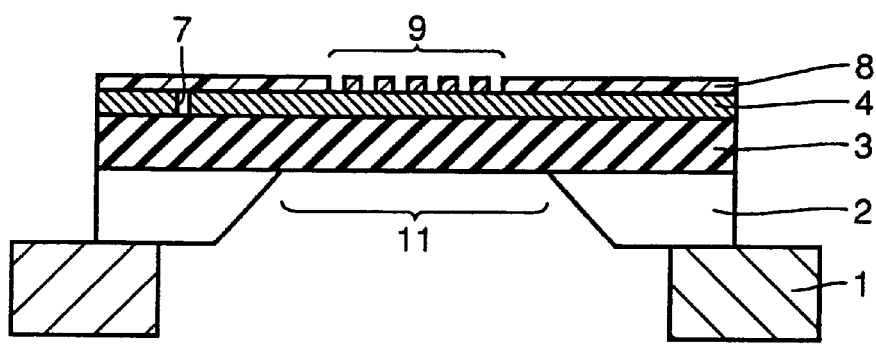

Then, the position of opening 7 functioning as the alignment mark is detected with an electron beam or the like emitted to opening 7. Based on this position information, the positions of X-ray absorber 4 and resist 8 are detected, and the transfer circuit pattern is written on resist 8 by the electron beam writing method while detecting the positions in this manner. By developing resist 8 thus written, transfer circuit pattern 9 is formed on resist 8 as shown in FIG. 6.

As described above, transfer circuit pattern 9 is formed using opening 7, which functions as the alignment mark, for position detection of X-ray absorber 4 and resist 8. Therefore, the accuracies of position and size of the transfer circuit pattern 9 can be improved.

Opening 7 is located in the region which is spaced from the region bearing transfer circuit pattern 9, and is situated over substrate 2 with membrane 3 therebetween. Therefore, significant change in position of opening 7 can be prevented in the step of writing the transfer circuit pattern, even when membrane 3 situated on window 11 vibrates or a distortion occurs due to resist stress relief or heat caused by the step of writing the transfer circuit pattern. Consequently, it is possible to prevent deterioration of the accuracy of position detection of the X-ray mask due to change in position of opening 7. Therefore, transfer circuit pattern 9 having a high position accuracy can be formed. Accordingly, the X-ray mask provided with the transfer circuit pattern having a high position accuracy can be manufactured.

Then, X-ray absorber 4 masked with resist 8 is partially removed to form transfer circuit pattern 10 (see FIG. 1). Thereafter, resist 8 is removed.

In this manner, the X-ray mask according to the embodiment 1 of the invention shown in FIG. 1 can be manufactured.

(Embodiment 2)

Referring to FIGS. 7 to 10, description will now be given on steps of manufacturing the X-ray mask of an embodiment 2 of the invention.

Figure 7:
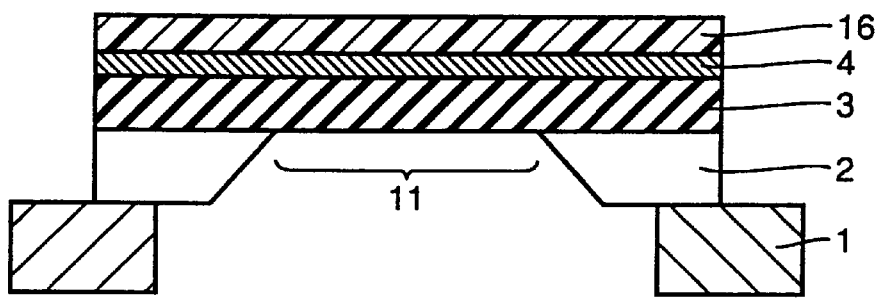
FIGS. 7 to 10 are cross-sectional views showing 1st to 4th steps in a process of manufacturing the X-ray mask of the embodiment 2 of the invention, respectively.

First, a structure shown in FIG. 7 is produced through steps similar to those of manufacturing the X-ray mask of the embodiment 1 of the invention shown in FIG. 2. The X-ray mask in the first step of the process of manufacturing the X-ray mask according to the embodiment 2 of the invention shown in FIG. 7 basically has the same structure as the X-ray mask in the first step of the process of manufacturing the X-ray mask of the embodiment 1 of the invention shown in FIG. 2. In the step of manufacturing the X-ray mask of the embodiment 2 of the invention shown in FIG. 7, however, a resist 16 formed on X-ray absorber 4 is thicker than resist 5 in the step of manufacturing the X-ray mask of the embodiment 1 of the invention shown in FIG. 2. This is because resist 16 is used in both the step of forming opening 7 (see FIG. 9) functioning as the alignment mark and the step of forming transfer circuit pattern 10 (see FIG. 1), and therefore must endure the etching in these two steps.

Figure 8:
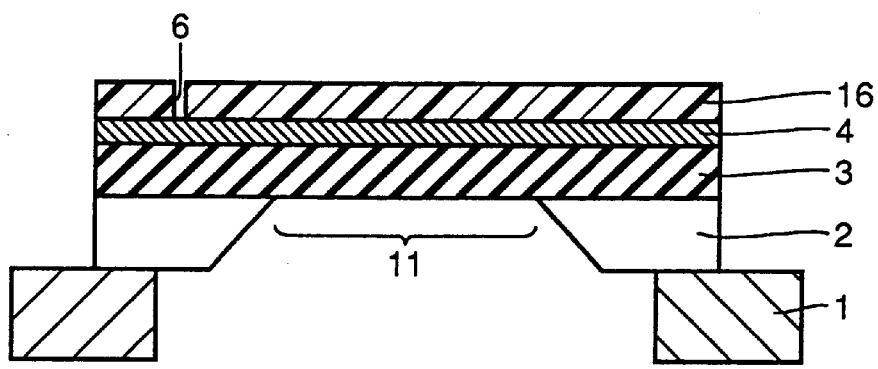

As shown in FIG. 8, light exposure is performed on resist 16 to form alignment mark pattern 6. In this step, alignment mark pattern 6 is formed in a region not overlapping with window 11, i.e., a region outside window 11, as is done also in the embodiment 1 of the invention.

Since the light exposure is performed for forming alignment mark pattern 6, this can achieve an effect similar to that in the case where the light exposure is performed for forming alignment mark pattern 6 on resist 5 in the step of manufacturing the X-ray mask of the embodiment 1 of the invention shown in FIG. 3. Electron beam exposure may be employed for forming alignment mark pattern 6.

Figure 9:
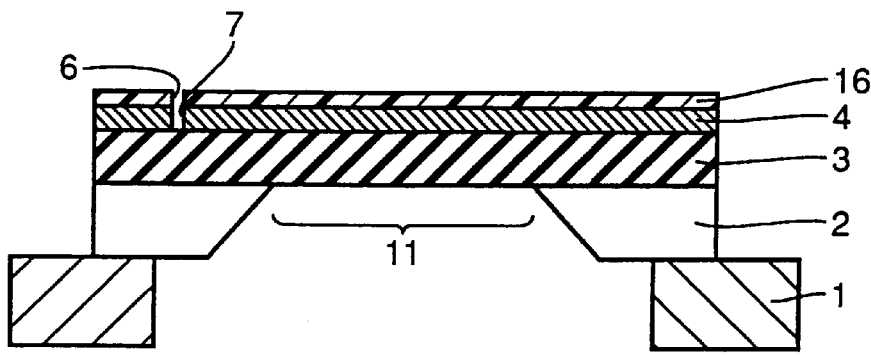

Then, as shown in FIG. 9, X-ray absorber 4 masked with resist 16 is partially removed by etching to form opening 7 functioning as the alignment mark.

Figure 10:
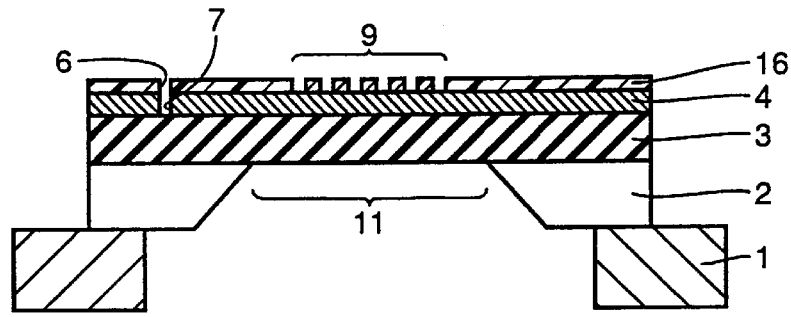

Then, as shown in FIG. 10, the position of opening 7 functioning as the alignment mark is detected with an electron beam or the like emitted to opening 7. Based on this position information, the positions of X-ray absorber 4 and resist 16 are detected, and the transfer circuit pattern is written on resist 16 by the electron beam writing method while detecting the positions in this manner. By developing resist 16 after the above writing, transfer circuit pattern 9 is formed on resist 16.

As described above, alignment mark pattern 6 for forming opening 7 and transfer circuit pattern 9 for forming transfer circuit pattern 10 (see FIG. 1) are written on the same resist 16. Therefore, one of the steps of forming the resists in the embodiment 1 of the invention can be eliminated. Accordingly, in addition to the effect achieved by the embodiment 1 of the invention, such an effect can be achieved that the X-ray mask provided with the transfer circuit pattern having a high position accuracy can be produced through further simplified steps.

Thereafter, X-ray absorber 4 masked with resist 16 is partially removed by etching to form transfer circuit pattern 10 (see FIG. 1). By removing resist 16, the X-ray mask shown in FIG. 1 can be manufactured.

(Embodiment 3)

Figure 11:
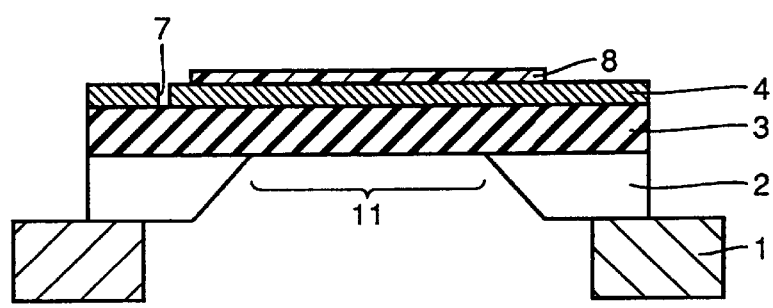
FIG. 11 is a cross-sectional view showing a step of manufacturing an X-ray mask of an embodiment 3 of the invention.
Figure 12:
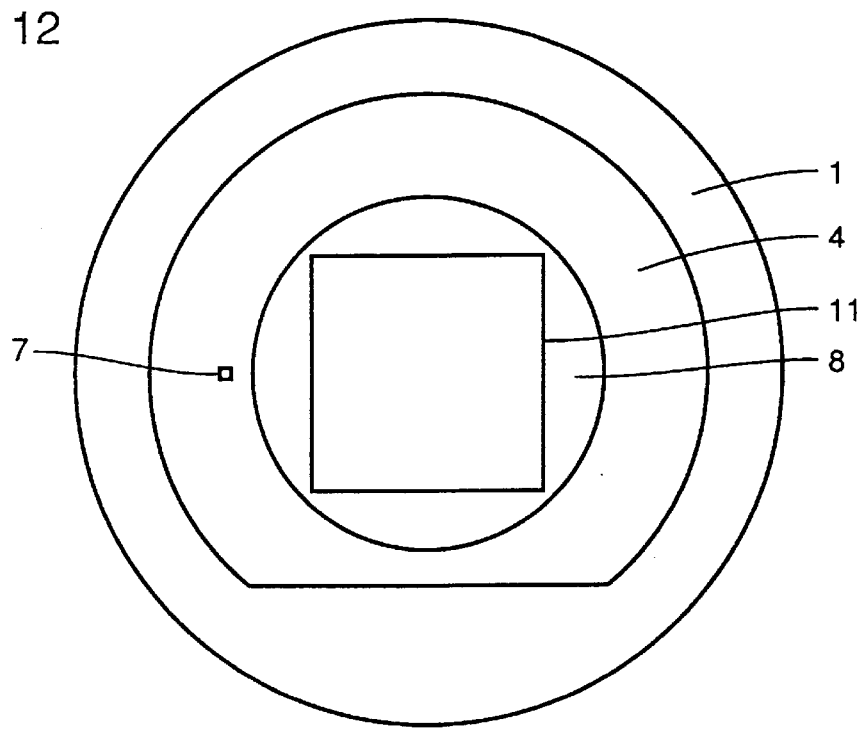
FIG. 12 is a plan view showing a step of manufacturing the X-ray mask of the embodiment 3 of the invention.

Referring to FIGS. 11 and 12, description will be given on the process of manufacturing an X-ray mask of an embodiment 3 of the invention.

After performing the steps of manufacturing the X-ray mask of the embodiment 1 of the invention shown in FIGS. 2 to 4, resist 8 is formed only on a region of X-ray absorber 4 located above window 11 and, more specifically, a region where the transfer circuit pattern is to be formed. Thus, resist 8 exposing opening 7 is formed on X-ray absorber 4. Resist 8 may be formed in such a manner that a resist is first applied over an entire surface of X-ray absorber 4, and then the resist is removed from a peripheral portion covering opening 7. By removing the resist from an area on opening 7, opening 7 is exposed.

As shown in FIG. 12, resist 8 formed only in the region over window 11 may have a circular form or may have a square form similar to the form of window 11. Instead of entirely removing the resist from the peripheral portion of X-ray absorber 4, the resist may be removed only from a region above and near opening 7, in which case a similar effect can be achieved.

The position of opening 7 functioning as the alignment mark is detected with an electron beam or the like emitted to opening 7. Based on this position information, the positions of X-ray absorber 4 and resist 8 are detected, and the transfer circuit pattern is written on resist 8 by the electron beam writing method while detecting the positions in this manner.

The resist is not present above opening 7 functioning as the alignment mark. Therefore, such a problem can be prevented that characteristics of the resist are deteriorated due to irradiation with the light or electron beam for detecting the alignment mark, and thereby detection of opening 7 is impeded. Consequently, the position of opening 7 functioning as the alignment mark can be performed accurately. Thereby, the transfer circuit pattern having a high accuracy can be formed. This embodiment 3 may be applied to the embodiment 2, in which case a similar effect can be achieved.

(Embodiment 4)

Figure 13:
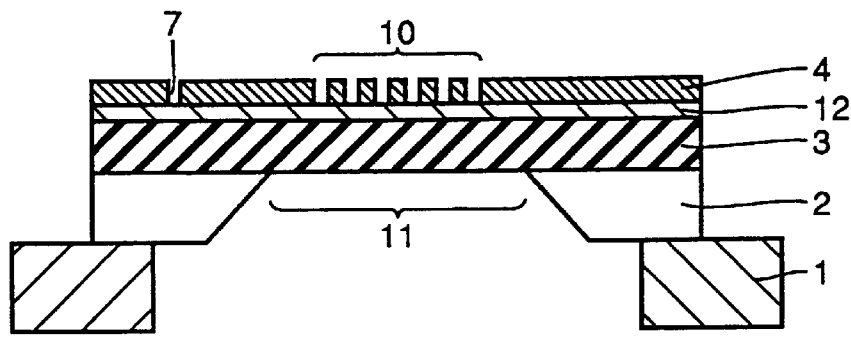
FIG. 13 is a cross-sectional view of an X-ray mask of an embodiment 4 of the invention.

Referring to FIG. 13, the X-ray mask according to the embodiment 4 of the invention will now be described below.

Referring to FIG. 13, the X-ray mask according to the embodiment 4 of the invention basically has the same structure as the X-ray mask of the embodiment 1 of the invention shown in FIG. 1. However, in the X-ray mask of the embodiment 4 of the invention shown in FIG. 13, an etching stopper 12, which is made of a material different in etching rate from X-ray absorber 4, is arranged between membrane 3 and X-ray absorber 4 for an etching step which is performed for forming opening 7 and transfer circuit pattern 10.

Since etching stopper 12 is employed as described above, damage to membrane 3 by the etching can be prevented in the etching step for forming opening 7 functioning as the alignment mark and transfer circuit pattern 10.

Since opening 7 is formed in the region not overlapping with window 11 in the plan view, this embodiment can achieve an effect similar to that by the X-ray mask of the embodiment 1 of the invention shown in FIG. 1.

Referring to FIGS. 14 to 20, steps of manufacturing the X-ray mask of the embodiment 4 of the invention will be described below.

Figure 14:
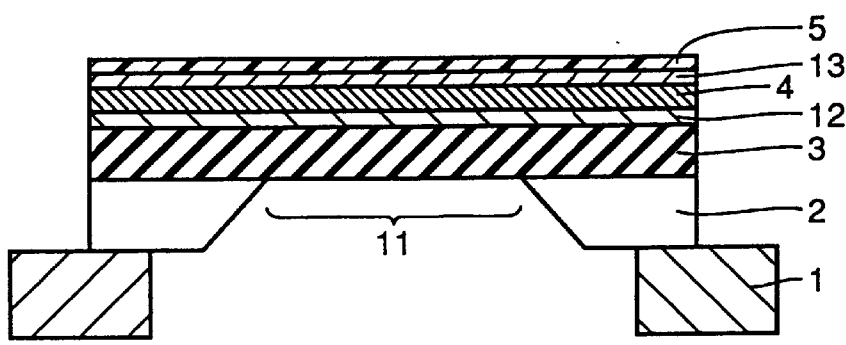
FIGS. 14 to 20 are cross-sectional views showing 1st to 7th steps in a process of manufacturing the X-ray mask of the embodiment 4 of the invention shown in FIG. 13, respectively.

As shown in FIG. 14, membrane 3 is formed on substrate 2. Window 11 exposing the rear surface of membrane 3 is formed in substrate 2. Support ring 1 is arranged under substrate 2. Etching stopper 12 is formed on membrane 3. X-ray absorber 4 is formed on etching stopper 12. An etching mask 13 is formed on X-ray absorber 4. Resist 5 is formed on etching mask 13.

Figure 15:
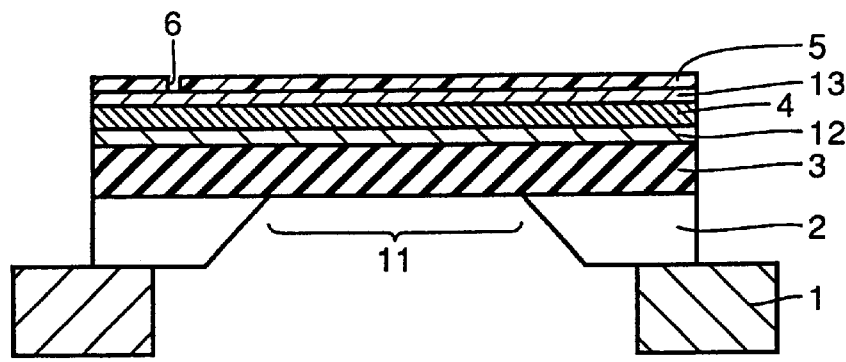

As shown in FIG. 15, alignment mark pattern 6 is formed in the region of resist 5 not overlapping with window 11 in the plan view by the light exposing method. In this step, alignment mark pattern 6 may be formed by an electron beam exposing method.

Figure 16:
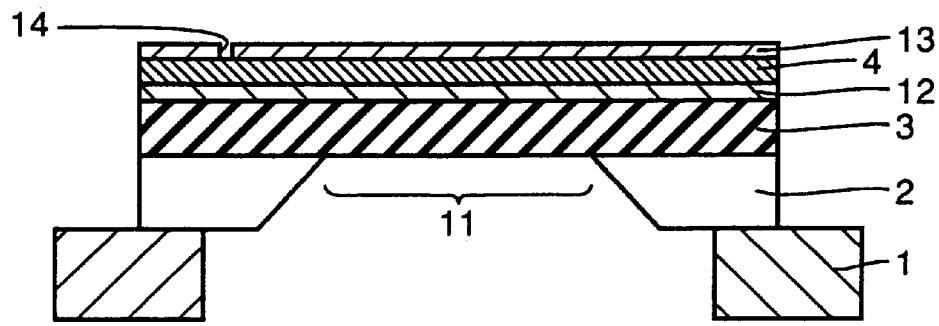

Etching mask 13 masked with resist 5 is partially removed by etching to form an alignment mark pattern 14 in etching mask 13 (see FIG. 16). Thereafter, resist 5 is removed. In this manner, the structure shown in FIG. 16 is formed.

Figure 17:
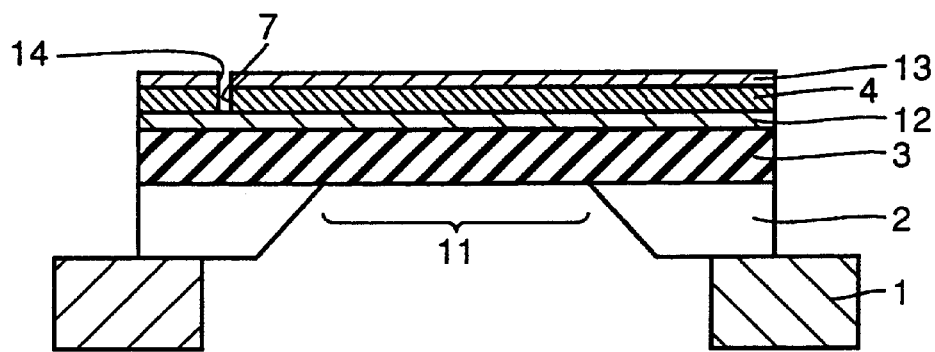

Then, as shown in FIG. 17, X-ray absorber 4 masked with etching mask 13 is partially removed by etching to form opening 7 functioning as the alignment mark.

Figure 18:
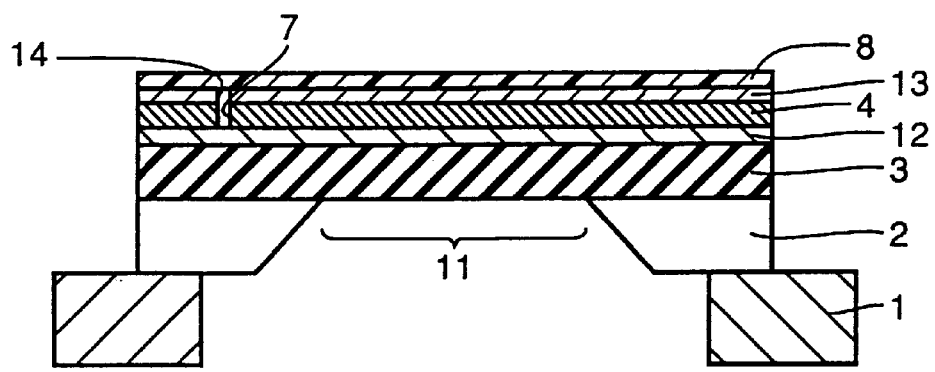

As shown in FIG. 18, resist 8 is applied over etching mask 13.

Figure 19:
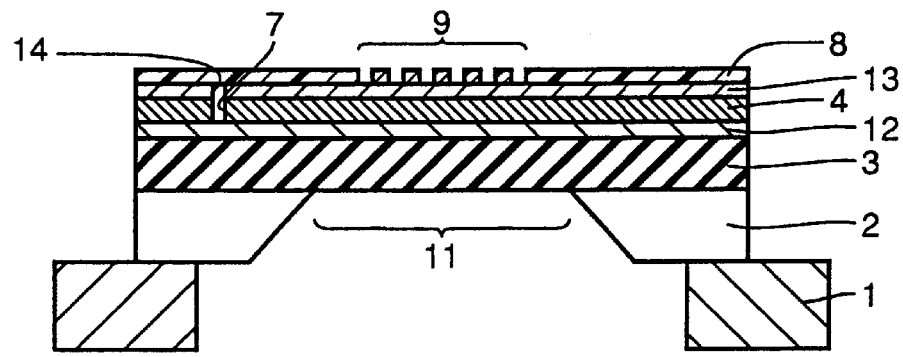

Then, as shown in FIG. 19, the position of opening 7 functioning as the alignment mark is detected with an electron beam or the like emitted to opening 7. Based on this position information, the positions of resist 8 and others are detected, and transfer circuit pattern 9 is formed on resist 8 by the electron beam writing method while detecting the positions in this manner.

Figure 20:
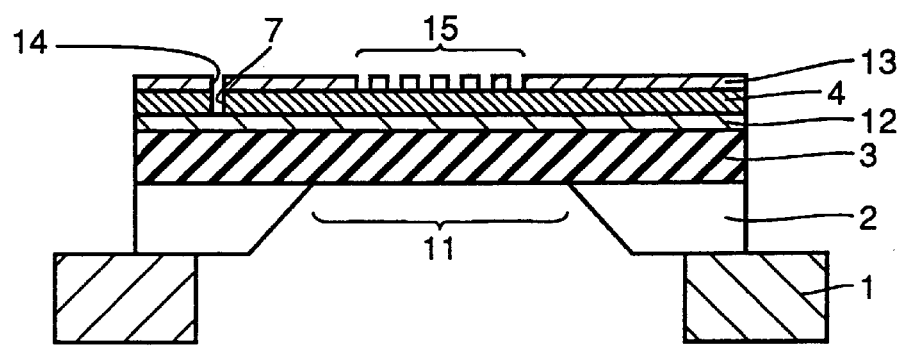

Etching mask 13 masked with resist 8 is partially removed to form a transfer circuit pattern 15 in etching mask 13 (see FIG. 20). Thereafter, resist 8 is removed. In this manner, the structure shown in FIG. 20 is formed.

X-ray absorber 4 masked with etching mask 13 is partially removed by etching to form transfer circuit pattern 10 (see FIG. 13). Thereafter, etching mask 13 is removed so that the X-ray mask shown in FIG. 13 is formed.

As shown in FIGS. 17 and 20, etching mask 13 and etching stopper 12 are subjected two times to the etching in the process of forming opening 7 and transfer circuit pattern 10 (see FIG. 13). Therefore, etching mask 13 and etching stopper 12 must have film thicknesses which can endure the etching performed two times.

For example, it is now assumed that X-ray absorber 4 has a film thickness of 500 nm, the rate of overetching in the first etching process is 20%, and the selection ratio of X-ray absorber 4 with respect to etching mask 13 and etching stopper 12 is 10 when etching X-ray absorber 4. In this case, the required thicknesses of etching mask 13 and etching stopper 12 can be calculated as follows.

Etching mask 13 is first discussed. In the etching step for forming opening 7 functioning as the alignment mark shown in FIG. 17, the thickness reduced by this etching is 600 nm when calculated based on X-ray absorber 4, because X-ray absorber 4 is 500 nm in thickness and the overetching rate thereof is 20%. Since the selection ratio of X-ray absorber 4 with respect to etching mask 13 is 10, the thickness of etching mask 13 removed in this etching step is 60 nm.

In the etching step for forming transfer circuit pattern 10, the thickness of etching mask 13 reduced thereby is equal to the foregoing value, and thus is 60 nm. Therefore, etching mask 13 must have a thickness of 120 nm or more.

Meanwhile, etching stopper 12 is etched as follows. In the etching step for forming opening 7 shown in FIG. 17, a portion of etching stopper 12 forming the bottom of opening 7 is subjected to the etching correspondingly to the overetching quantity. Therefore, the thickness of etching stopper 12 reduced in the first etching step is 10 nm.

In the etching step for forming transfer circuit pattern 10, etching stopper 12 is subjected to the etching to remove its portion forming the bottom of transfer circuit pattern 10 correspondingly to the overetching quantity, similarly to the first etching step. Thus, the portion of etching stopper 12 forming the bottom of transfer circuit pattern 10 is removed by 10 nm.

Meanwhile, etching stopper 12 is exposed at the bottom of opening 7 even at the start of the etching step for forming transfer circuit pattern 10. Therefore, etching stopper 12 is subjected to the etching similarly to etching mask 13. Accordingly, the thickness of etching stopper 12 removed by this etching step is 60 nm which is equal to the reduced thickness of etching mask 13.

Therefore, the total thickness of etching stopper 12 reduced by the foregoing two etching steps is largest at the bottom of opening 7, and is equal to 70 nm. Thus, according to the process of manufacturing the X-ray mask of the embodiment 5 of the invention, etching stopper 12 must have a thickness of 70 nm or more.

Further, in the etching step of forming opening 7 functioning as the alignment mark shown in FIG. 17, the etching conditions may be adjusted such that a selection ratio of X-ray absorber 4 with respect to etching mask 13 and etching stopper 12 is 100, whereby it is possible to reduce thicknesses of etching mask 13 and etching stopper 12 which are reduced in the above etching step. As a result, it is possible to reduce the required thicknesses of etching mask 13 and etching stopper 12.

Under the above conditions, the etching step of forming opening 7 reduces the thickness of etching mask 13 by 6 nm, and also reduces the thickness of etching stopper 12 by 1 nm. If the foregoing conditions are employed in the etching step of forming transfer circuit pattern 10, the required minimum thickness of etching mask 13 is 66 nm, and the required minimum thickness of etching stopper 12 is 61 nm.

If there is a difference between the size of opening 7 functioning as the alignment mark and the size of the interconnection pattern and others formed in transfer circuit pattern 10, the etching conditions for forming opening 7 may be determined depending on the size thereof, and thus may be independent of the etching conditions for forming transfer circuit pattern 10 which is determined depending of the size of the interconnection pattern and others. Thereby, both opening 7 and transfer circuit pattern 10 can be formed with high size accuracies. As a result, the X-ray mask provided with the transfer circuit pattern having a high position accuracy can be produced.

The etching conditions for forming opening 7 may be adjusted such that the accuracy of the pattern configuration is not extremely high, but the selection ratio of X-ray absorber 4 with respect to etching mask 13 and etching stopper 12 is sufficiently large (e.g., 100). The etching conditions for forming transfer circuit pattern 10 may be adjusted such that the selection ratio of X-ray absorber 4 with respect to etching mask 13 and etching stopper 12 is not significantly high, but the accuracy of pattern configuration is sufficiently high. Thereby, it is possible to produce the X-ray mask provided with the transfer circuit pattern having a high position accuracy while reducing the required thicknesses of etching mask 13 and etching stopper 12.

(Embodiment 5)

Referring to FIGS. 21 to 26, description will now be given on a process of manufacturing an X-ray mask according to an embodiment 5 of the invention.

Figure 21:
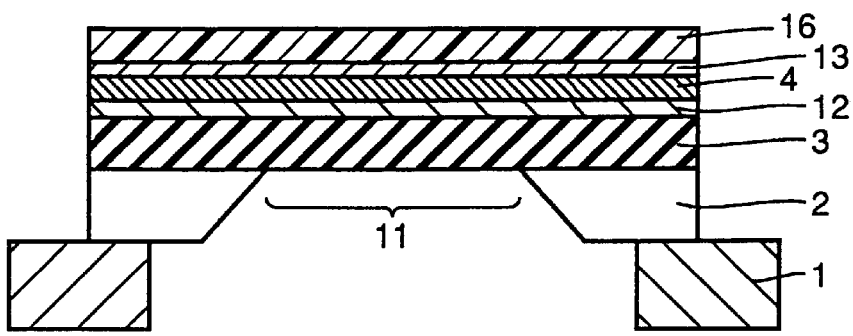
FIGS. 21 to 26 are cross-sectional views showing 1st to 6th steps in a process of manufacturing an X-ray mask of an embodiment 5 of the invention.

The structure which is shown in FIG. 21 and is the same as that shown in FIG. 14 is formed through a manufacturing step similar to that for forming the structure of the X-ray mask shown in FIG. 14. However, in the process of manufacturing the X-ray mask of the embodiment 5 of the invention shown in FIG. 21, resist 16 is used in both the step of forming opening 7 functioning as the alignment mark and the step of forming transfer circuit pattern 10, as will be described later. Therefore, resist 16 is thicker than that in the manufacturing process of the embodiment 4 of the invention.

Figure 22:
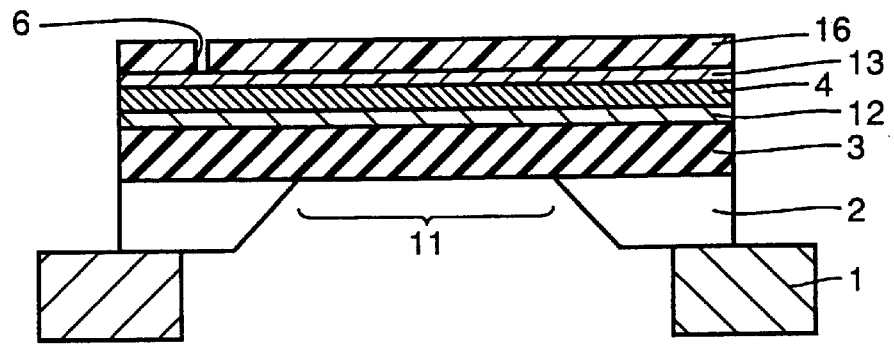

As shown in FIG. 22, alignment mark pattern 6 is formed in resist 16 similarly to the process of manufacturing the X-ray mask of the embodiment 4 of the invention shown in FIG. 15.

Figure 23:
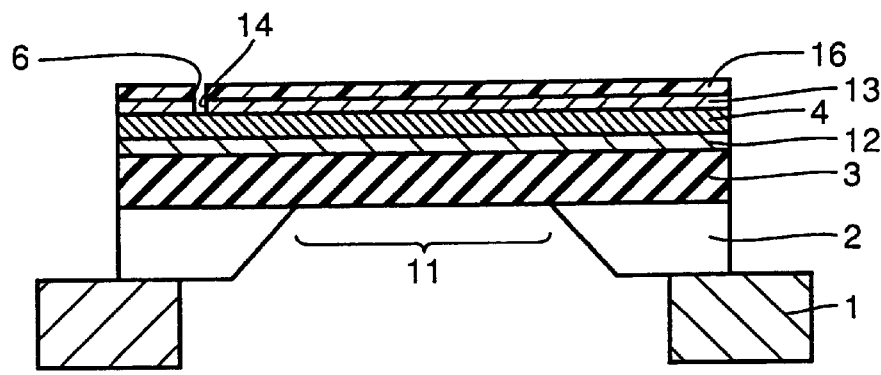

Etching mask 13 masked with resist 16 is partially removed to form alignment mark pattern 14 in etching mask 13. In this manner, the structure shown in FIG. 23 is formed.

Figure 24:
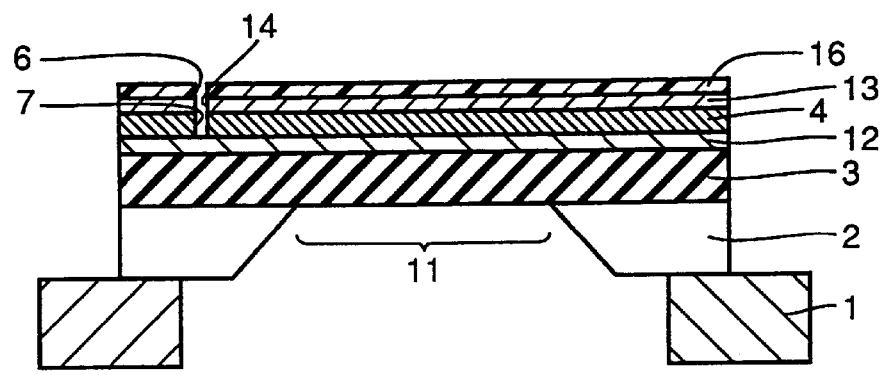

Then, as shown in FIG. 24, X-ray absorber 4 masked with resist 16 and etching mask 13 is partially removed by etching to form opening 7.

Figure 25:
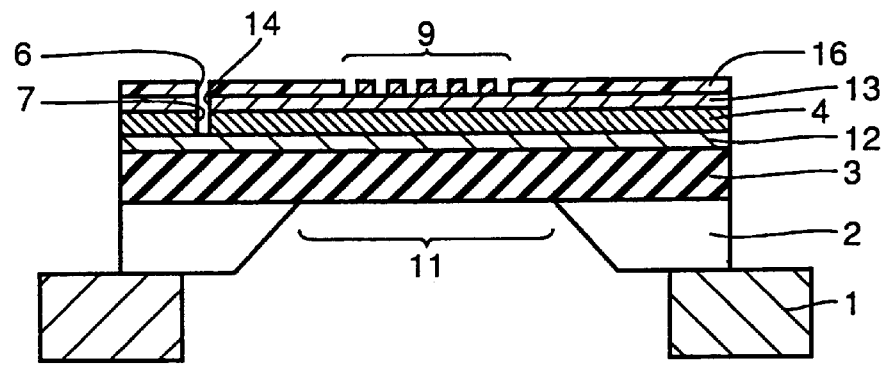
Figure 26:
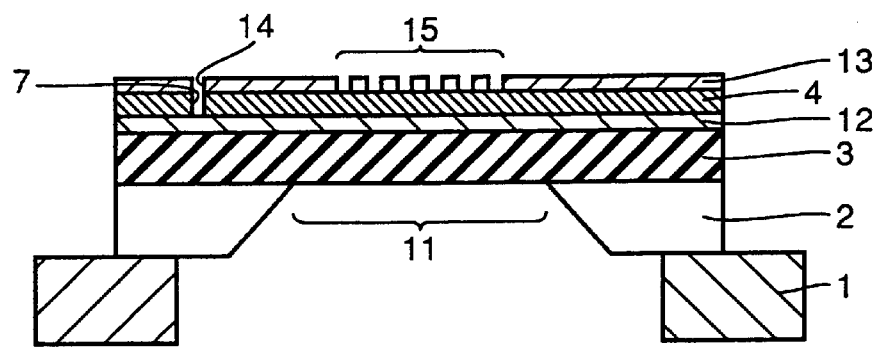
Figure 27:
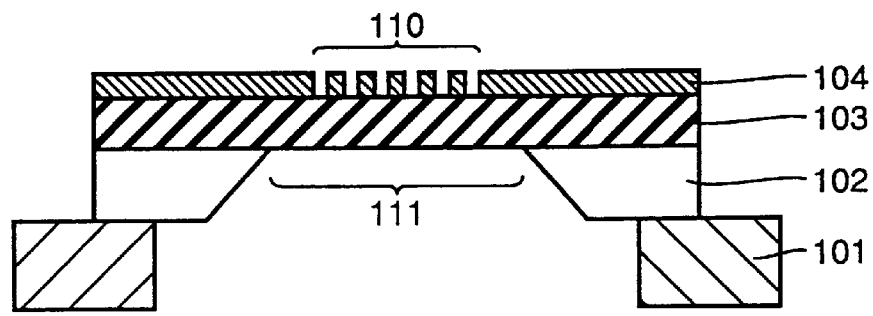
FIG. 27 is a cross-sectional view of an X-ray mask in the prior art.
Figure 28:
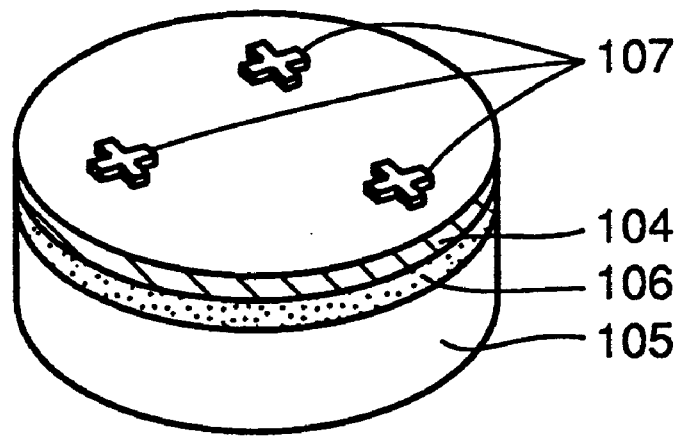
FIG. 28 is a perspective view of an X-ray mask provided with an alignment mark proposed in the prior art.

As shown in FIG. 25, transfer circuit pattern 9 is formed on resist 16 by the electron beam writing.

As described above, alignment mark pattern 6 and transfer circuit pattern 9 are formed in resist 16. Therefore, the manufacturing process can be simpler than that in the embodiment 4 of the invention which requires the step of forming the resist to be performed twice.

Etching mask 13 masked with resist 16 is partially removed by etching to form transfer circuit pattern 15 in etching mask 13. Thereafter, resist 16 is removed to form the structure shown in FIG. 26. Thereafter, X-ray absorber 4 masked with etching mask 13 is partially removed by etching to form transfer circuit pattern 10 (see FIG. 13) in X-ray absorber 4. Thereafter, etching mask 13 is removed so that the X-ray mask shown in FIG. 13 is produced.

If there is a difference between the size of opening 7 and the size of the interconnection pattern and others formed in transfer circuit pattern 10, the etching conditions for forming opening 7 may be determined depending on the size thereof, and thus may be independent of the etching conditions for forming transfer circuit pattern 10 which is determined depending of the size of the interconnection pattern and others. Thereby, an effect similar to that of the embodiment 4 of the invention can be achieved.

The concept of the invention can be applied to the electron beam writing (EB writing) for directly writing a circuit pattern on a resist on a semiconductor substrate with an electron beam. The electron beam writing requires an alignment mark, which is prepared, in the prior art, by depositing a film on the semiconductor substrate and by forming the alignment mark from this film. However, this film forming process can be eliminated by employing the concept of the invention and forming the opening functioning as the alignment mark in the semiconductor substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An X-ray mask comprising:

a substrate;

a membrane formed on said substrate and allowing passage of X-rays; and an X-ray absorber formed on said membrane and intercepting transmission of X-rays, wherein said substrate includes a window exposing said membrane, and said X-ray absorber includes:

a transfer circuit pattern, and an alignment mark formed in a region not overlapping with said window in a plan view.

2. The X-ray mask according to claim 1, wherein said alignment mark is an opening formed in said X-ray absorber.

3. The X-ray mask according to claim 1, further comprising:

a protective film arranged between said substrate and said X-ray absorber.

4. A method of manufacturing an X-ray mask, comprising the steps of:

forming a membrane allowing passage of X-rays on a substrate;

forming an X-ray absorber intercepting transmission of X-rays on said membrane;

forming a window exposing said membrane in said substrate;

forming a first mask layer on said X-ray absorber;

writing a first mask pattern on said first mask layer;

effecting development on said first mask layer to form a first mask pattern layer;

removing said X-ray absorber using said first mask pattern layer as a mask, and thereby forming an opening functioning as an alignment mark in a region not overlapping with said opening in a plan view.

5. The method of manufacturing the X-ray mask according to claim 4, further comprising the steps of:

removing said first mask pattern layer;

forming a second mask layer on said X-ray absorber;

writing a second mask pattern on said second mask layer while performing position detection of said second mask layer using said opening as the alignment mark;

effecting development on said second mask layer to form a second mask pattern layer; and removing said X-ray absorber to form a transfer circuit pattern, using said second mask pattern layer as a mask.

6. The method of manufacturing the X-ray mask according to claim 5, wherein said step of writing said first mask pattern includes an exposure step using light, and said step of writing said second mask pattern includes a writing step using an electron beam.

7. The method of manufacturing the X-ray mask according to claim 5, wherein said step of forming said second mask layer includes a step of forming a second mask layer exposing said opening on said X-ray absorber.

8. The method of manufacturing the X-ray mask according to claim 5, wherein said step of forming said opening include a first etching step of removing said X-ray absorber, said step of forming said transfer circuit pattern includes a second etching step of removing said X-ray absorber, and said first and second etching steps are performed under different conditions, respectively.

9. The method of manufacturing the X-ray mask according to claim 4, further comprising:

writing a second mask pattern on said first mask layer while performing position detection of said first mask layer using said opening as an alignment mark;

forming a second mask pattern layer by effecting development on said first mask layer; and forming a transfer circuit pattern by removing said X-ray absorber, using said second mask pattern layer as a mask.

10. The method of manufacturing the X-ray mask according to claim 9, wherein said step of writing said first mask pattern includes an exposure step using light, and said step of writing said second mask pattern includes a writing step using an electron beam.

11. The method of manufacturing the X-ray mask according to claim 9, wherein said step of forming said opening includes a first etching step of removing said X-ray absorber, said step of forming said transfer circuit pattern includes a second etching step of removing said X-ray absorber, and said first and second etching steps are performed under different conditions, respectively.

* * * * *